(12) United States Patent
Hsu et al.

(10) Patent No.: US 7,250,783 B2
(45) Date of Patent: Jul. 31, 2007

(54) CURRENT MIRROR MULTI-CHANNEL LEAKAGE CURRENT MONITOR CIRCUIT AND METHOD

(75) Inventors: Steven K. Hsu, Lake Oswego, OR (US); Ram Krishnamurthy, Portland, OR (US); Chris Hyung-il Kim, West Lafayette, IN (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/022,800

(22) Filed: Dec. 28, 2004

(65) Prior Publication Data

US 2005/0104612 A1  May 19, 2005

Related U.S. Application Data

(62) Division of application No. 10/401,792, filed on Mar. 31, 2003, now Pat. No. 6,844,750.

(51) Int. Cl.
*G01R 31/02* (2006.01)

(52) U.S. Cl. ...................................... 324/763

(58) Field of Classification Search ................ 324/765, 324/763, 767–769, 158.1; 327/525, 132, 327/66, 53, 534, 537–547; 326/33–34, 21
See application file for complete search history.

(56) References Cited

U.S. PATENT DOCUMENTS

| | | | | |
|---|---|---|---|---|
| 5,570,034 A | * | 10/1996 | Needham et al. ............ 324/763 |
| 5,654,895 A | * | 8/1997 | Bach et al. .................... 702/65 |
| 6,177,827 B1 | | 1/2001 | Ota ............................. 327/536 |
| 6,246,243 B1 | | 6/2001 | Audy .......................... 324/550 |
| 6,469,489 B1 | | 10/2002 | Bourquin et al. ............. 324/96 |

* cited by examiner

*Primary Examiner*—Ha Tran Nguyen
*Assistant Examiner*—Tung X. Nguyen
(74) *Attorney, Agent, or Firm*—Ked & Associates, LLP

(57) ABSTRACT

A current mirror multi-channel leakage monitor circuit and method measures die leakage and generates digital keeper control bits to control a process compensated dynamic circuit. The leakage monitor enables high resolution on-chip leakage measurements in multiple locations on a die, thereby saving test time and enabling both die to die and within die process compensation.

23 Claims, 17 Drawing Sheets

| PROCESS | $R_{SLOW}$ ←——— TYPICAL ———→ $R_{FAST}$ | | | | | |
|---|---|---|---|---|---|---|
| V1 | 0 | 1 | 1 | 1 | 1 | 1 |
| V2 | 1 | 0 | 1 | 1 | 1 | 1 |
| V3 | 1 | 1 | 0 | 1 | 1 | 1 |
| V4 | 1 | 1 | 1 | 0 | 1 | 1 |
| V5 | 1 | 1 | 1 | 1 | 0 | 1 |
| V6 | 1 | 1 | 1 | 1 | 1 | 0 |
| b2 | 0 | 0 | 0 | 1 | 1 | 1 |
| b1 | 0 | 1 | 1 | 0 | 0 | 1 |
| b0 | 1 | 0 | 1 | 0 | 1 | 0 |
| KEEPER SIZE | 1.7% | 3.4% | 5.1% | 6.8% | 8.5% | 10.2% | 11.0% |

*FIG.15*

CURRENT MIRROR MULTI-CHANNEL LEAKAGE CURRENT MONITOR CIRCUIT AND METHOD

This application is a Divisional of U.S. patent application Ser. No. 10/401,792 filed on Mar. 31, 2003, now U.S. Pat. No. 6,844,750, the subject matter of which is incorporated herein by reference.

BACKGROUND OF THE INVENTION

1. Field of the Invention

The field of invention generally relates to electronics and more particularly to a variable keeper strength process compensated dynamic circuit and method and a leakage current monitor circuit and method.

2. Background of the Related Art

The increasing leakage (e.g. current leakage in a transistor) in scaled technologies has forced designers to increase keeper sizes in dynamic circuits to obtain acceptable levels of robustness. However, the performance of dynamic circuits (e.g, wide-operating range (OR) gates) starts degrading with increasing keeper size. Register files and caches are particularly susceptible to this type of performance degradation, since wide-OR type dynamic circuits are often used in these types of circuits. Along with the increase in leakage, die-to-die (D2D) and within-die (WID) process variations cause the leakage distribution to become wider and wider. This process variation adversely affects the yield of usable dies obtained from a given manufacturing lot run.

Compared to previous technology generations, a significant portion of leaky dies may even fail with a strong keeper and low leakage dies may also suffer from the use of an unnecessarily strong keeper. A keeper is used to maintain a voltage level applied to a dynamic node stable. For example, a keeper may be used to hold a dynamic node to high when none of the pull down paths connected to the node are evaluating. In another example, a keeper may be used to hold a domino circuit high during clock stoppage and improve noise margins.

A flexible design technique and approach that uses a stronger keeper for the excess leakage dies and a relatively weaker keeper for low leakage dies can improve both overall robustness and performance. The problems and disadvantages in the related art are addressed and a process-compensated dynamic circuit and method are introduced using a variable strength keeper scheme to restore the robustness in excess leakage dies and avoid the performance loss and other penalties associated with low leakage dies.

Increasing the ultimate, final production yields from the production and manufacturing of integrated circuits and other electronic devices and components is another goal pursued by many companies in the quest for reducing costs and increasing production efficiencies. Some ways of achieving these goals are increasing the utilization rate of components produced in a given manufacturing lot is to develop and apply process compensation schemes, using as many devices from a given lot run as possible, by managing and compensating for the different component variances and implementing designs that are tolerant of these design variances.

There are different types of process compensation schemes in the related art. For example, process compensation schemes, such as adaptive body biasing and variable strength keeper based dynamic circuits are emerging design techniques where die-to-die (D2D) and within die (WID) parameter variations are deteriorating and becoming worse as scaling continues to increase. A common technical underpinning or theme behind these various process compensation techniques is the requirement of a method to accurately detect the process skew that is occurring.

BRIEF DESCRIPTION OF THE DRAWINGS

The invention will be described in detail with reference to the following drawings in which like reference numerals refer to like elements wherein:

FIG. 15 is an exemplary grouping of logic values and keeper sizes;

DETAILED DESCRIPTION OF PREFERRED EMBODIMENTS

Figure 1:
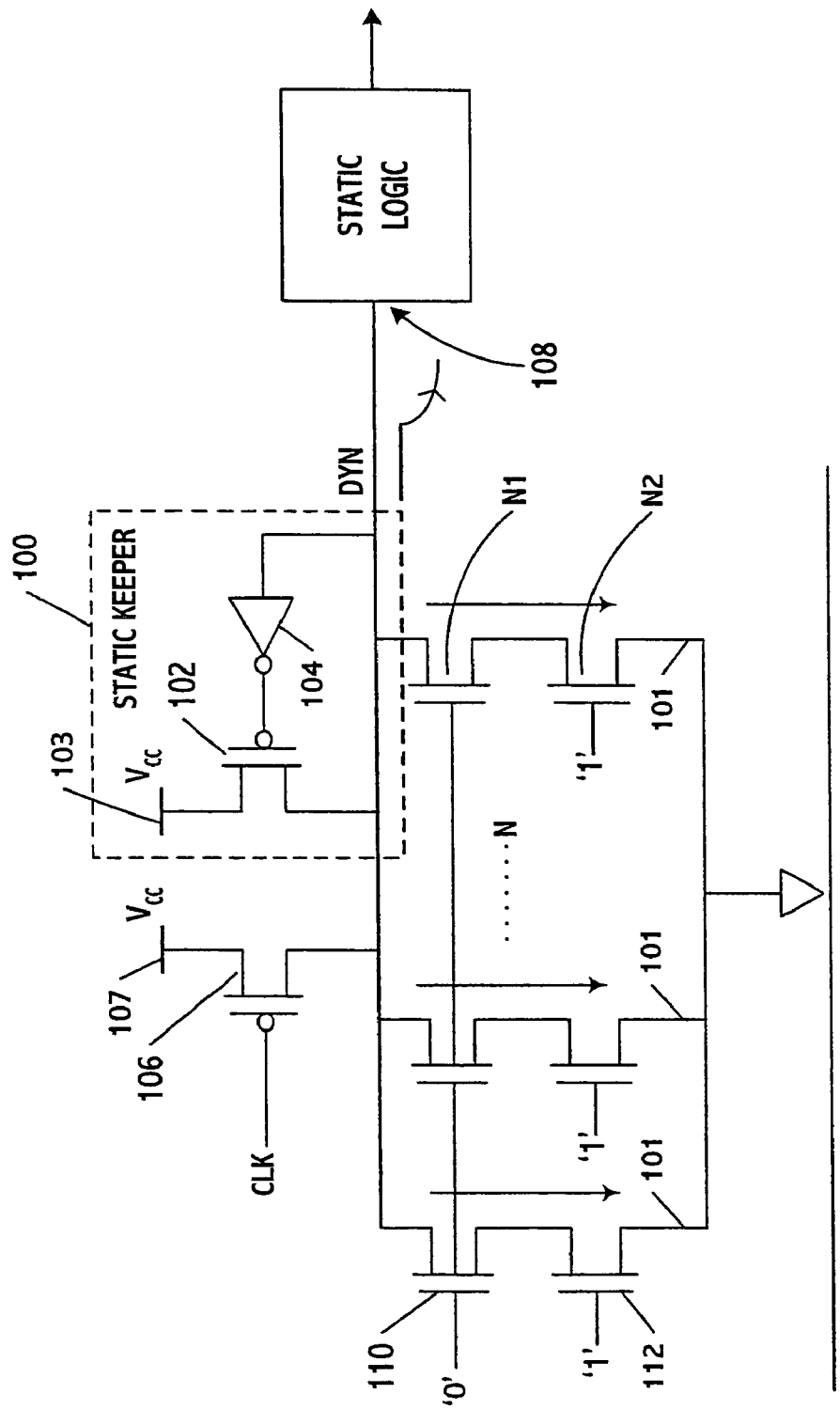
FIG. 1 is an illustration of a related art wide-OR dynamic circuit with a static keeper.

In the following detailed description of the various exemplary embodiments, reference is made to the accompanying drawings that show, by way of illustration, specific embodiments in which the invention made be practiced. In the drawings, like numerals describe substantially similar components throughout the several views. These exemplary embodiments are described in sufficient detail to enable those skilled in the art to practice the invention and changes may be made without departing from the spirit and scope of the exemplary embodiments of the present invention. Moreover, it is to be understood that various embodiments of the invention, although different, are not necessarily mutually exclusive. For example, a particular feature, structure, or characteristic described in one embodiment may be included within other embodiments. Therefore, the following detailed description is not to be taken in a limiting sense. The scope of the present invention is delineated by the claims, along with the full scope of equivalents to which such claims are entitled.

Microprocessors and other electronic devices and components have various leakage distributions and intrinsic parameter fluctuations. Different statistical deviations in robustness and performance attributed to parameter fluctuation is especially problematic in dynamic circuits, since excessive leakage can cause false evaluations and transitions and many critical paths in circuits include these types of dynamic circuits.

FIG. 1 shows a related art wide-OR dynamic gate with a static keeper 100. In FIG. 1, a keeper is used to hold a dynamic node to high when none of the pull down paths are evaluating. The plurality of pull down paths 101 evaluate in the downward direction indicated by the arrows and the number of pull down paths used can be one to N where N is a positive integer.

In FIG. 1, a static keeper circuit 100 is shown as part of a related art wide-OR dynamic circuit, including a PMOS transistor 102 whose gate is coupled to the output of an inverter 104. The drain of another PMOS transistor 106, is coupled to the drain of transistor 102 and the gate of transistor 106 is coupled to a clock signal (clk). The source of transistor 102 is connected to supply voltage (Vcc) 103 and the source of transistor 106 is connected to supply voltage 107.

A plurality of up to N transistor pairs (Pair 1:110, 112 up to Pair N:N1, N2) are also coupled to transistors 102 and 106 and these transistors are then coupled to the input of static logic (e.g. an inverter) 108. FIG. 1 shows that the transistors that make up the N transistor pairs are N-type metal oxide semiconductor (NMOS) transistors.

However, in a related art circuit like the one shown in FIG. 1, higher levels of NMOS leakage can lower the dynamic node voltage, possibly causing a non-recoverable false transition in the output. Related art static keepers are sized, such that the dynamic node can withstand the worst-case leakage and remain at '1'.

As technology scales, the leakage distribution gets wider. This leads to an increasing number of higher leakage dies, thereby requiting a stronger keeper to maintain functionality. However, a relatively strong keeper that is sized for the worst-case leakage will impact performance in lower leakage dies where a strong keeper is unnecessary and is simply design overkill, as well as incurring performance penalties. A process-compensated dynamic circuit technique that adjusts the keeper strength depending on the die leakage can provide robustness to the leaky dies without any performance penalty in the less leaky dies.

The keeper strength of the process-compensated dynamic (PCD) circuit can be controlled using a digital technique, an analog technique or a combination of both. An analog technique has a potential of providing finer granularity using a single analog signal and appropriate shielding. Typically, in the related art, analog keeper circuits are simpler in design than the designs associated with digital keepers. However, in the presence of crosstalk noise, power supply voltage variations, process variations, and other deleterious influences or environmental constraints, analog solutions require additional care and compensation circuitry to address these problems. Failure to address these concerns will diminish any potential advantage that an analog design may have over a digital design.

Figure 2:
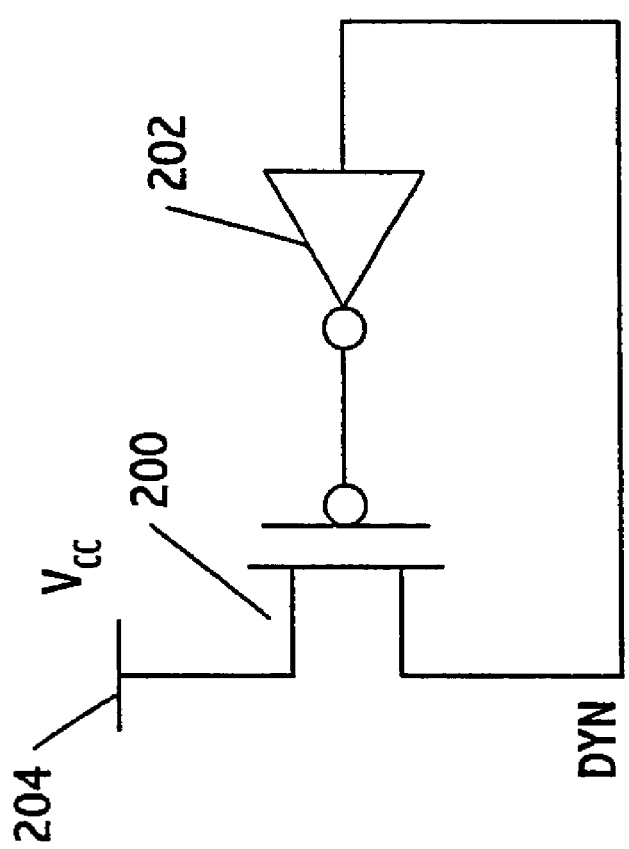
FIG. 2 is an illustration of a related art static keeper.

Another example of a related art static keeper is shown in FIG. 2. In FIG. 2, the gate of a P-type metal oxide semiconductor (PMOS) transistor 200 is coupled to the output of an inverter 202, the drain of transistor 200 is coupled to the input of inverter 202, and the source is coupled to a supply voltage 204. When the output of inverter 202 is high, transistor 200 is turned off and conversely, when the output of transistor 202 is low, transistor 200 is turned on.

One exemplary embodiment of the present invention is a high-resolution on-chip leakage current monitor (LCM) system, which can be used for a variable strength keeper based process-compensated dynamic (PCD) circuit, as well as a programmable keeper circuit and a controller for generating signals for programming that circuit. In one exemplary embodiment, three (3) bit control signals are generated by the controller for programming the strength of the keeper circuit. Some exemplary ways of generating the control bits will be discussed later in the detailed description. Those skilled in the art will appreciated that a higher or lower number of control bits can be used without departing from the spirit and scope of the present invention.

For example, the number of control bits can be increased to 4 bits or more to achieve even finer control granularity. However, increasing the number of bits increases the area penalty (i.e. increased circuit real estate) and performance penalty due to the additional keeper circuitry. Consequently, a process detector (e.g., a circuit that generates the control bits) with a very high resolution maybe used to offset these effects.

Figure 3:
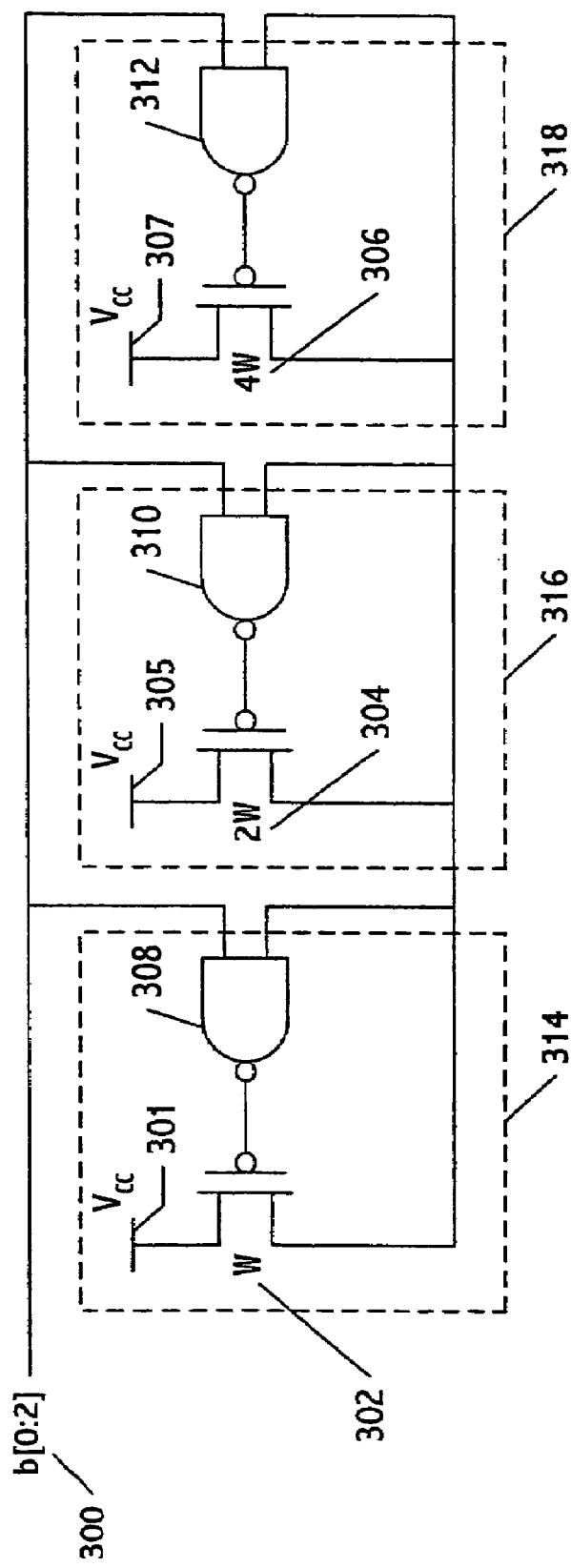
FIG. 3 is an exemplary embodiment of a three bit digital keeper.

FIG. 3 illustrates an exemplary embodiment of a 3 bit control digital keeper with 3 binary-weighted keeper widths, i.e. having widths of W, 2W and 4W. The region in a transistor between the source and the drain is called a channel, and W refers to the width of this channel. For example, the width of some transistors can range from a fraction of a micrometer to several hundred micrometers, depending upon circuit design needs. The 3 control bits determine which of the 3 binary-weighted keepers should be activated.

In FIG. 3, PMOS transistors 302, 304 and 306 are coupled together. The sources of the transistors 302, 304 and 306 are coupled to supply voltages 301, 305 and 307. The outputs of the NAND gates are coupled to the gates of the transistors. As shown in FIG. 3, the output of NAND gate 308 is coupled to the gate of transistor 302, the output of NAND gate 310 is coupled to the gate of transistor 304, and the output of NAND gate 312 is coupled to the gate of transistor 306.

The NAND gates shown in the exemplary embodiment of FIG. 3 are two input NAND gates. Those skilled in the art will appreciate that other types of logic devices may be used without departing from the spirit and scope of the present invention. One of the inputs common to all three NAND gates (308, 310 and 312) is the three bit control input 300. The control input 300 is used to select which of the three binary-weighted keepers should be activated. The other input of the NAND gates is obtained from the electrical line coupling respective drains of transistors 302, 304 and 306.

In FIG. 3, the NAND gate of an activated keeper acts as an inverter, which makes the selected keeper function as a static keeper. The three possible keeper circuits in this exemplary embodiment that may be activated are 314, 316 and 318. The variable combinations of the 3 binary-weighted keepers allow 8 different effective keeper widths ranging from 0 to 7W with a step of W (i.e. 0, W, 2W, 3W, 4W, 5W, 6W, and 7W). Those skilled in the art will also appreciate that the sizes of all the keepers (or some permutation thereof) can also be the same size, without departing from the spirit and scope of the embodiments of the invention.

In FIG. 3, the dynamic node capacitance becomes larger than the conventional static keeper due to the added diffusion capacitances of the 3 transistors (e.g. PMOS Field Effect Transistors) and the gate capacitances of the 3 NAND gates. This makes the circuit evaluation slower, impacting performance when the keeper is programmed to be relatively weak.

Figure 4:
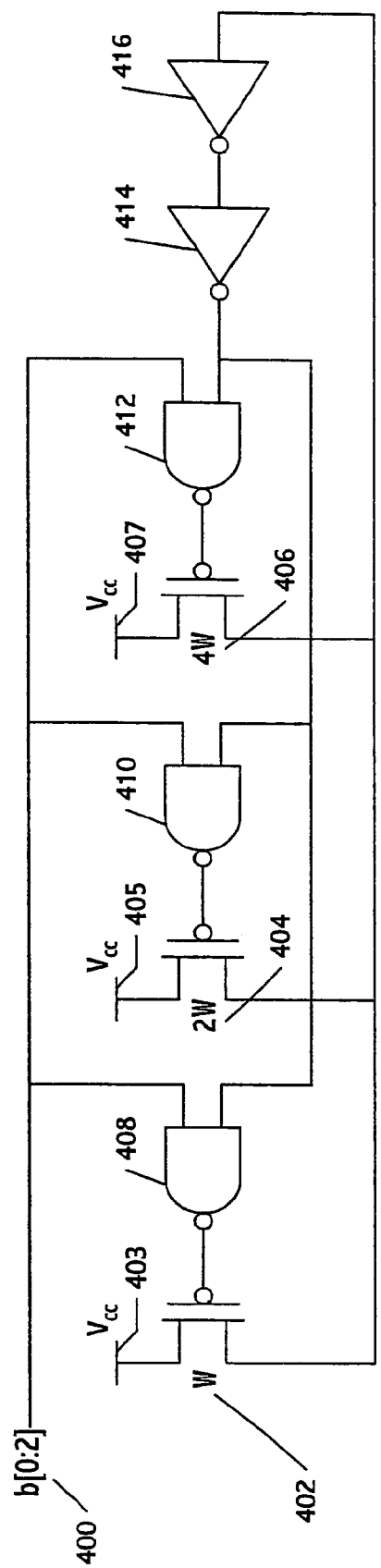
FIG. 4 is an exemplary embodiment of a decoupled three bit digital keeper process-compensated dynamic circuit.

To address the aforementioned scenario, a decoupled version of the 3 bit digital keeper is shown in the exemplary embodiment of FIG. 4. In FIG. 4, transistors 402, 404 and 406 are coupled together. The sources of the transistors 402, 404 and 406 are coupled to supply voltages 403, 405 and 407 respectively. The drains of transistors 402, 404 and 406 are coupled to the input of inverter 416. The output of inverter 416 is input into inverter 414. The output of inverter 414 is then input into each NAND gate (408, 410 and 412) as one of the NAND gate inputs. The other input into each two input NAND gate is the three bit control signal 400.

As further illustrated in FIG. 4, the output of NAND gate 408 is coupled to the gate of transistor 402, the output of NAND gate 410 is coupled to the gate of transistor 404 and the output of NAND gate 412 is coupled to the gate of transistor 406.

Instead of using a dynamic node as the input for the 3 NAND gates, a dynamic node signal is bypassed through the two inverters (414 and 416) and used for the NAND inputs. This exemplary configuration ensures that the gate capacitance is no longer tied to the dynamic node. The inverters used to bypass the dynamic node signal are selected so that they are close to a minimum size and therefore, do not add much additional load onto the dynamic node. This enables faster circuit evaluation and performance. Even though the two-inverter delay causes an extra contention between the keeper and the evaluation circuitry, the reduction in dynamic node capacitance confers an overall speed benefit to the circuit.

Figure 5:
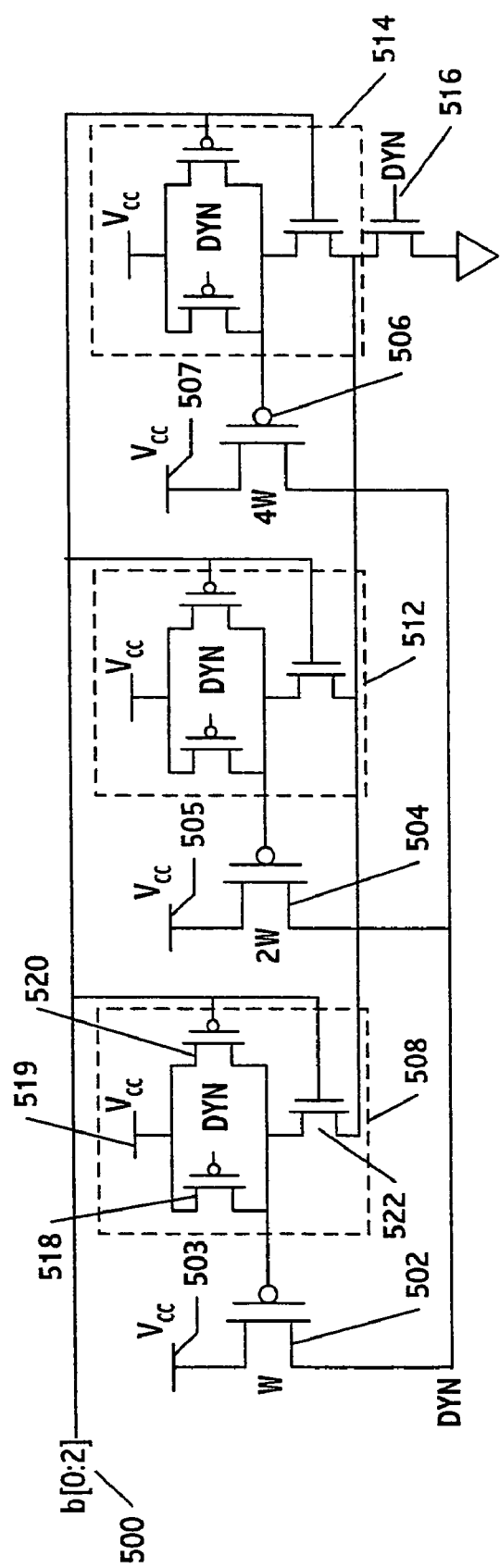
FIG. 5 is an exemplary embodiment of a shared NAND 3 bit digital keeper.

An exemplary embodiment of a shared NAND 3 bit keeper as illustrated in FIG. 5 can be used to reduce the keeper area penalty. In FIG. 5, transistors 502, 504 and 506 are coupled together. The sources of the transistors 502, 504 and 506 are coupled to respective supply voltages 503, 505 and 507. A three transistor gate driving circuit (508, 512, and 514) is coupled to the gate of transistors 502, 504 and 506.

One of the exemplary three transistor gate driving circuits, 508, will be discussed in detail. The other gate driving circuits, 512 and 514, are similar to 508 and will not be discussed separately. These gate driving circuit (508, 512 and 514) are commonly coupled to a transistor 516. Additionally, those skilled in the art will appreciate that variations in the types of transistors used in the gate driving circuits or any other transistor application may be used in various embodiments of the invention, without departing from the spirit and scope of the invention.

In gate driving circuit 508 of FIG. 5, three transistors 518, 520 and 522 are coupled together (two PMOS and one NMOS). A pair of PMOS transistors 518 and 520 are coupled in parallel. The sources of the PMOS transistors 518 and 520 are coupled to a supply voltage 519. The drain of NMOS transistor 522 is coupled to the drains of PMOS resistors 518 and 520. Note that in FIG. 5, each gate driving circuit (508, 512, and 514) commonly coupled to a transistor 516 is the functional equivalent of a NAND gate.

Since the NAND gates in the 3 keeper circuits shown in FIG. 3 have some logic in common, they can be shared. Therefore, the same functionality as a 3 bit keeper can be obtained with 2 less transistors. The width of the shared NMOS transistor is equal to the sum of 3 separate NMOS transistors thereby maintaining the robustness-delay characteristics. Even though this means that the equivalent transistor width will not change after sharing the pull down NMOS transistor, some of the contacts and interconnect wires can be eliminated, resulting in a denser keeper layout.

Figure 6:
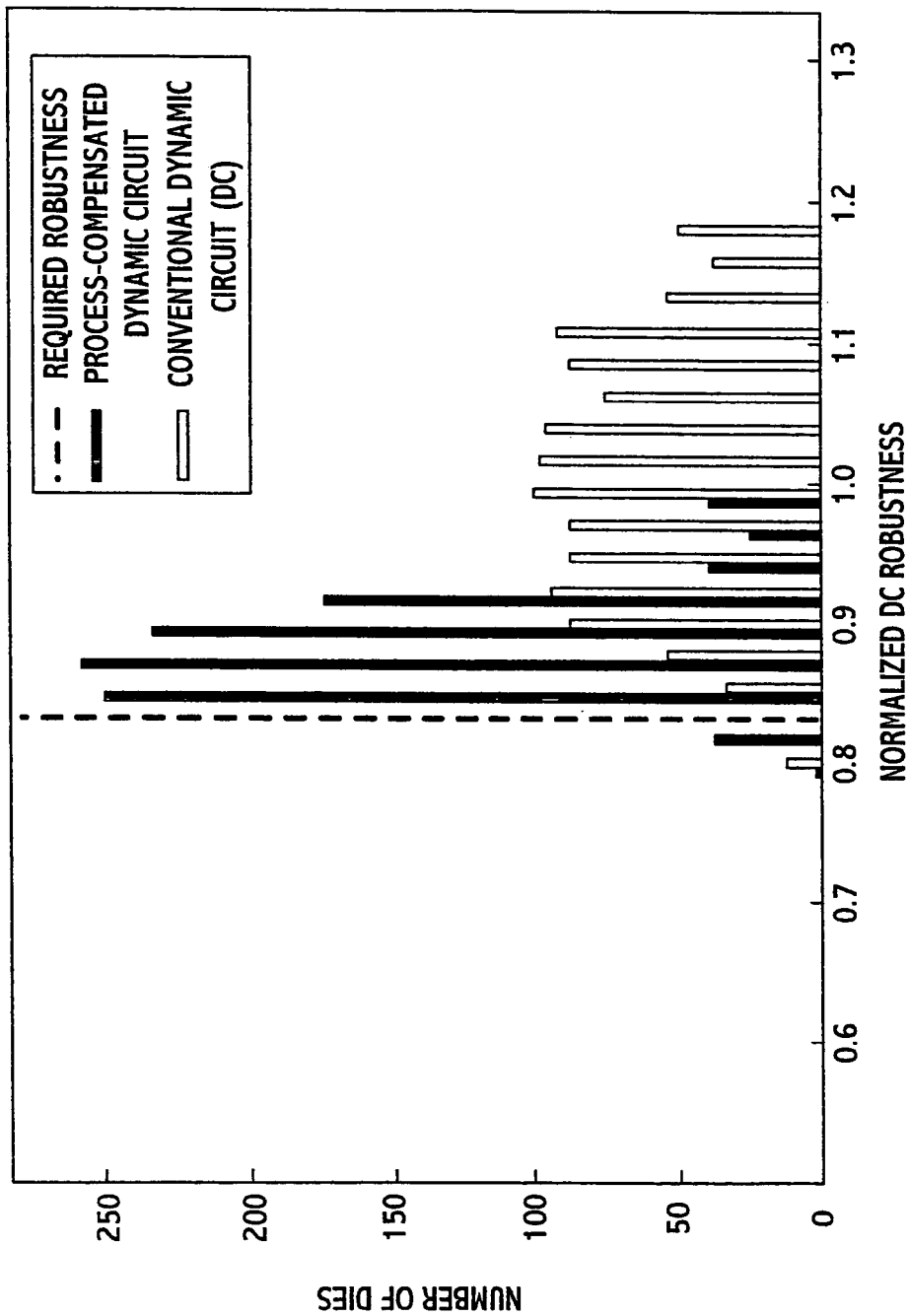
FIG. 6 illustrates an exemplary narrowing in robustness distribution by using a process-compensated dynamic circuit.

The effectiveness of a process-compensated dynamic circuit is shown in FIG. 6. FIG. 6 shows how the robustness distribution can be squeezed or compressed using the process-compensated dynamic circuit. The light colored distribution bars (indicating a conventional dynamic circuit) show the original robustness distribution when a conventional static keeper is used. By applying an exemplary 3 bit digital keeper scheme such as the one disclosed in FIG. 3, the robustness of the leaky dies can be recovered and the performance of low leakage dies can be improved.

In FIG. 6, the black colored distribution bars (indicating a process-compensated dynamic circuit) show the resulting improved robustness distribution from the application of one exemplary embodiment of the invention. In FIG. 6, the squeezed robustness distribution shown in black, indicates that 2.08% of the dies that originally did not meet the required robustness are mostly salvaged and usable, leaving only 0.47% of the chips with unacceptable robustness levels after applying the process compensation scheme.

Figure 7:
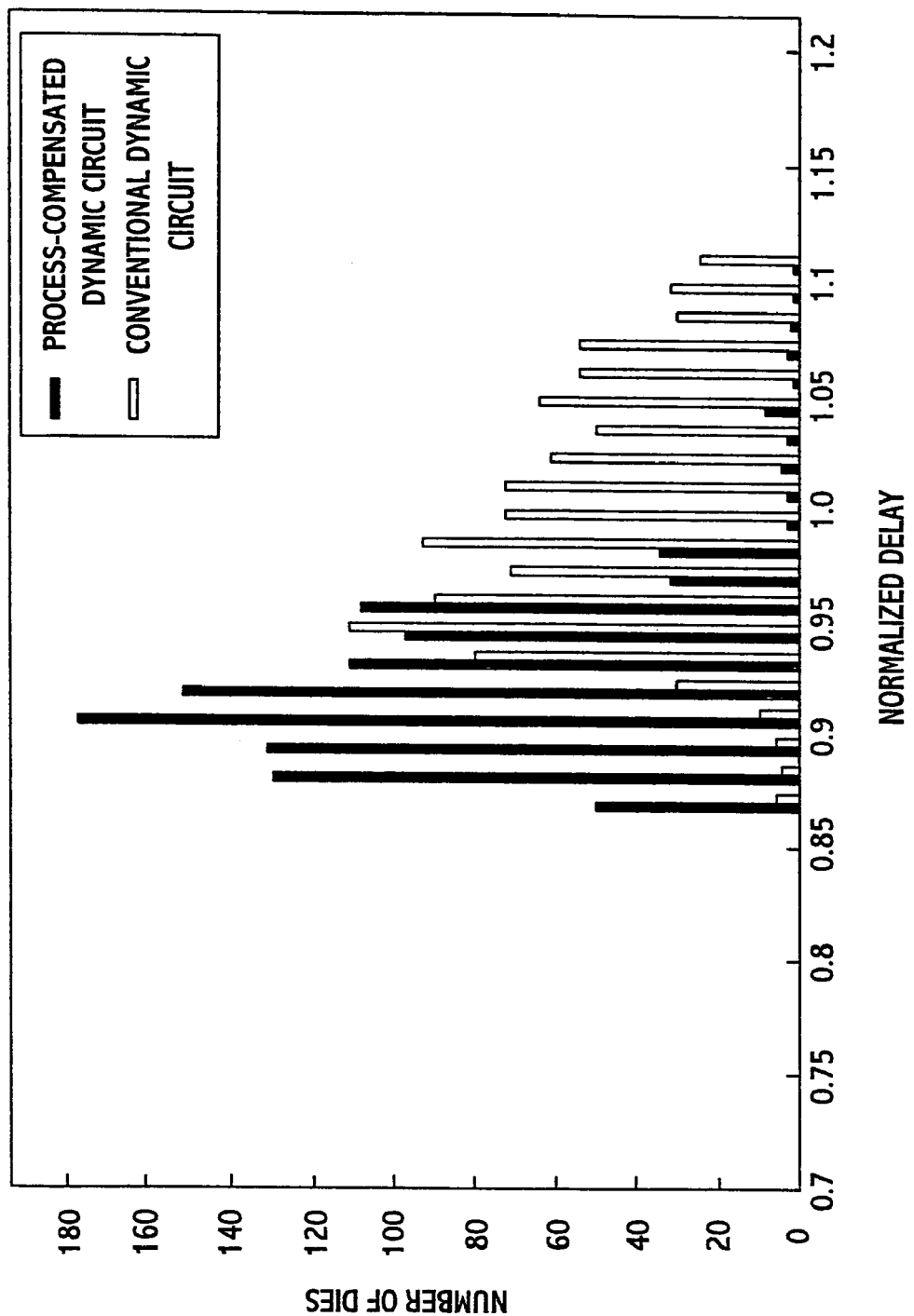
FIG. 7 illustrates an exemplary narrowing in delay distribution by using a process-compensated dynamic circuit.

The delay distribution is also squeezed or compressed (and consequently improved) accordingly as shown in FIG. 7. The average delay μ is improved by 8% and the σ/μ (standard dev./average) goes down from 5.22% to 3.96% meaning that a narrowing in delay distribution has occurred.

Figure 8:
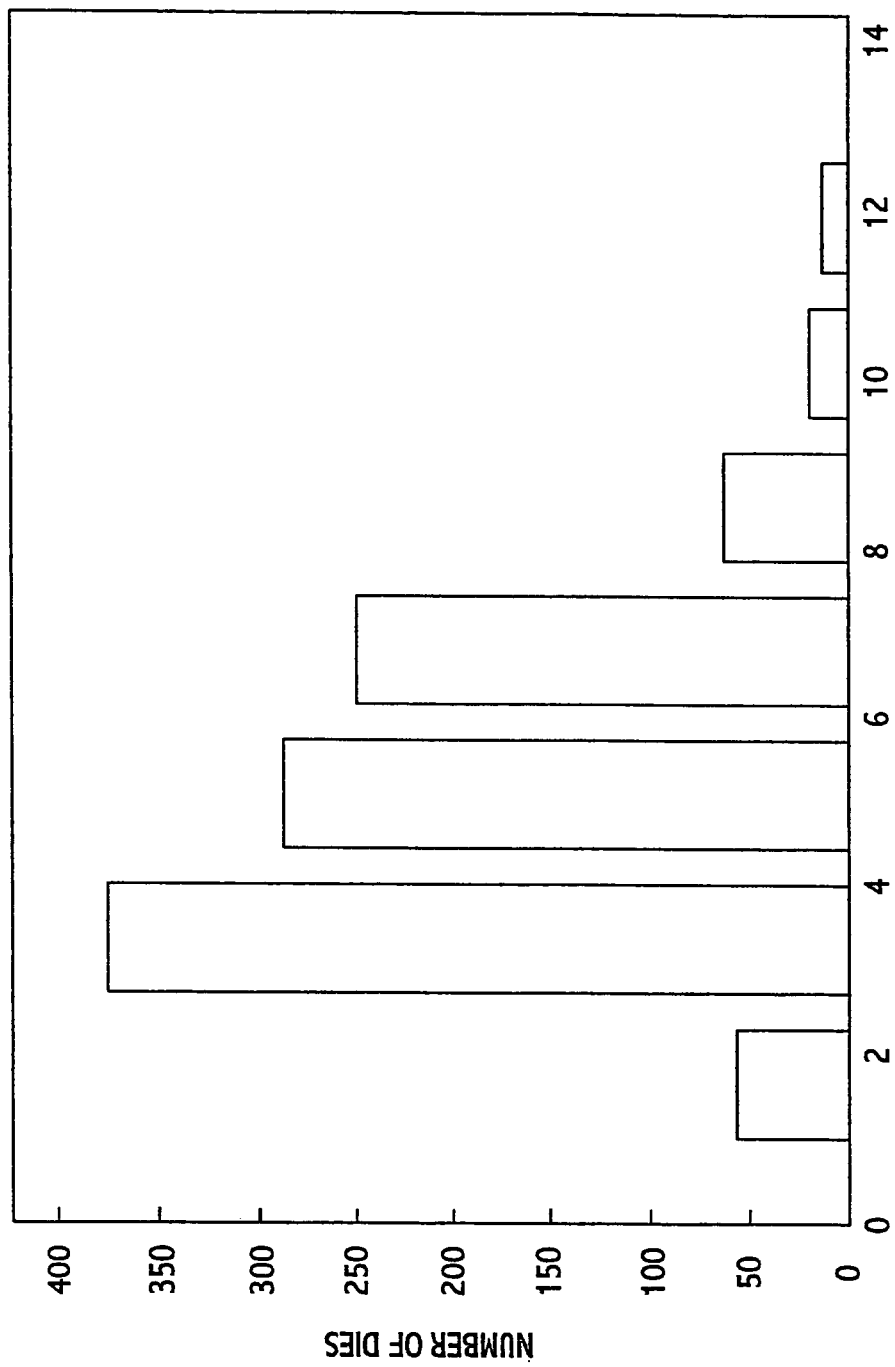
FIG. 8 illustrates an exemplary narrowing in keeper size distribution for a process compensated dynamic circuit.

Table 1 summarizes some of the advantages gained by using the process-compensated dynamic circuit as claimed in one embodiment of the present invention. Distribution of the keeper width is shown in FIG. 8. The seven (7) bars represent the number of dies using the keeper size denoted in the x-axis. As expected, a large portion of the dies ends up meeting the robustness requirement even with a weaker keeper than a conventional static keeper.

TABLE 1

Process compensation using variable strength keeper. (μ average, σ: standard dev.)

| | Robustness | | Delay | | Dies with unacceptable |
|---|---|---|---|---|---|
| | μ | σ/μ | μ | σ/μ | robustness |
| Conventional dynamic circuit | 1.00 | 9.40% | 1.00 | 5.22% | 2.08% |
| Process-compensated dynamic circuit | 0.88 | 4.17% | 0.92 | 3.96% | 0.47% |

As mentioned previously, there are different methods and techniques that may be used to generate the digital control signals and bits (e.g. 300 in FIG. 3, 400 in FIG. 4 and 500 in FIG. 5) for the process-compensated dynamic circuit.

One exemplary method for generating the digital control signals and bits is the wafer test or die test. In this method, the optimal keeper size can be one-time programmed, based on the measured leakage data obtained during wafer test or die test. Based upon these measurement results, the control bits can be permanently programmed. For example, fuses or read-only memory may be used to permanently program the control bits, based upon the obtained measurement results.

Another method for generating the digital control signals and bits is an on-chip leakage monitor circuit or circuits (LCMs). In order to compensate for the D2D process variations, a single LCM can be used to measure the die leakage. Average leakage obtained from a plurality of LCMs on different die locations can be used in case the WID leakage variation is considerable. Dedicated LCMs in the functional unit block (FUB) level can compensate for WID variation as well as D2D variation.

Figure 9:
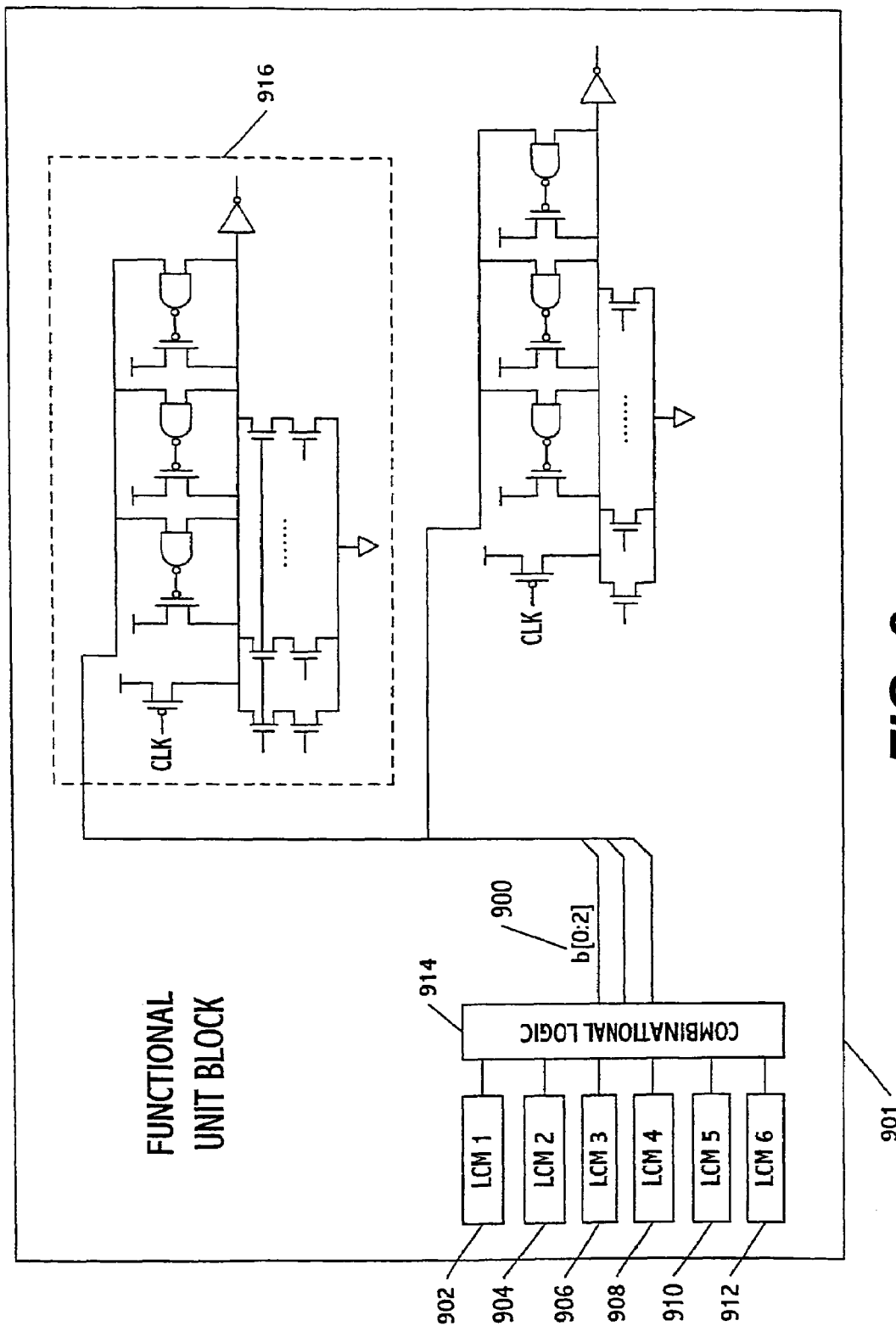
FIG. 9 illustrates an exemplary embodiment of a functional unit block with leakage current monitors and process-compensated dynamic gates.

FIG. 9 shows an exemplary embodiment of a FUB 901 with 6 LCMs (902, 904, 906, 908, 910 and 912) having different levels of leakage threshold to determine where the FUB leakage level sits or resides in one of seven ranges. The outputs of the 6 LCMs are converted into a binary encoded signal b[0:2] (900 in FIG. 9) through combinational logic 914. The control bits b[0:2] are routed within the FUB to adjust the strength of the keepers in a keeper circuit (e.g. 916). Those skilled in the art will appreciate that the total number of LCMs, the range categories established (e.g. greater than or less than 7), and the number of control bits used in the binary encoded signal, may all be modified into different combinations of exemplary embodiments without departing from the spirit and scope of the present invention.

Figure 10:
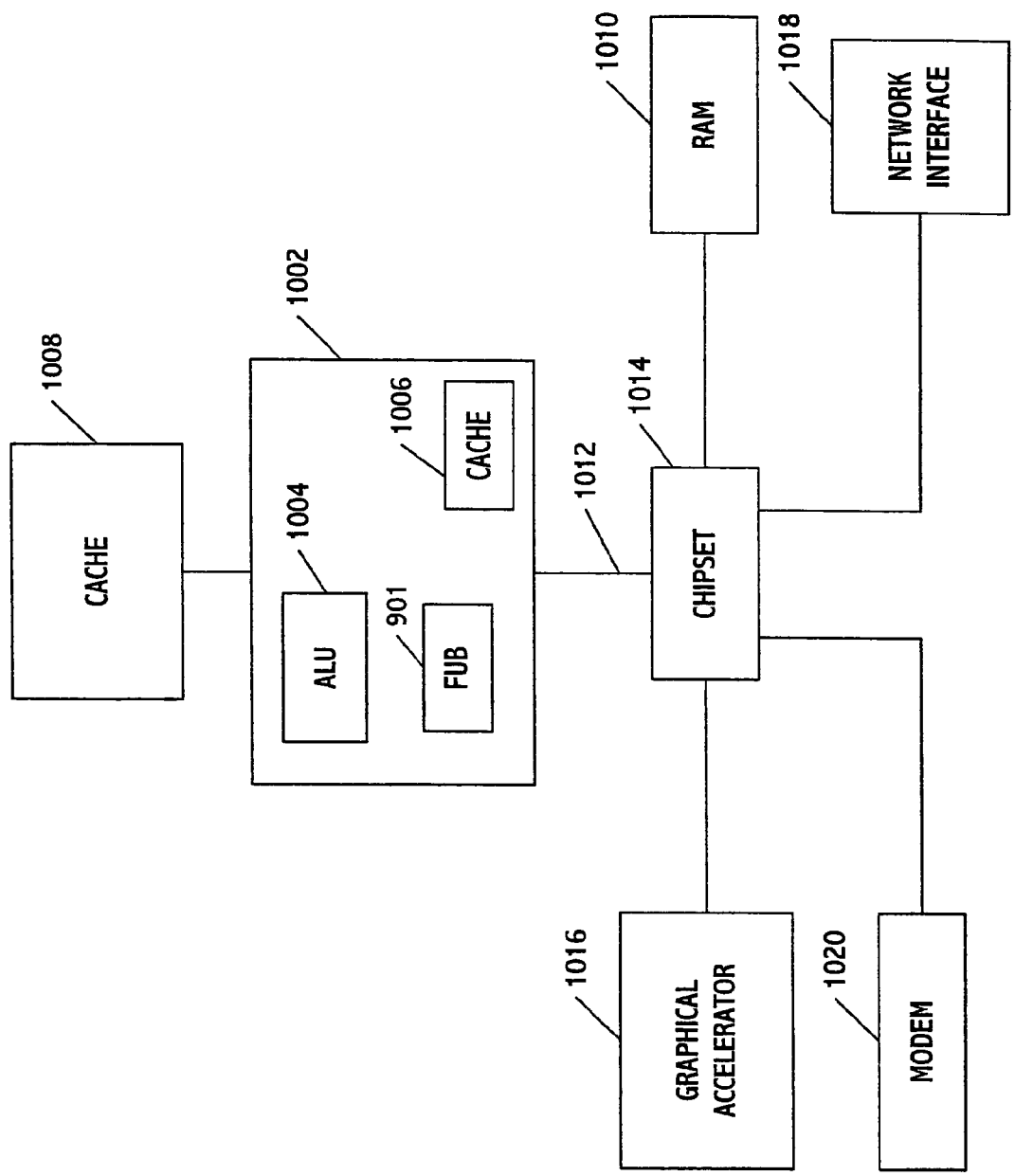
FIG. 10 is a diagram of a processing system including a process compensated dynamic circuit in accordance with an exemplary embodiment of the invention.

FIG. 10 shows an exemplary embodiment of a computer system incorporating a process compensated dynamic circuit. The computer system may include a microprocessor 1002, which include many sub-blocks, such as an arithmetic logic unit (ALU) (1004) and an on-die cache 1006. Microprocessor 1002 may also communicate to other levels of cache, such as off-die cache 1008. Higher memory hierarchy levels such as system memory 1010 (e.g. RAM), are accessed via host bus 1012 and chipset 1014. In addition, other off-die functional units, such as a graphics accelerator 1016, a network interface controller 1018, and a modem 1020 to name just a few, may communicate with microprocessor 1002 via appropriate busses, ports or other communication paths, and media.

In FIG. 10, the FUB discussed above (901 in FIG. 9) is shown as part of the overall computer system architecture illustrated in FIG. 10. Note, that the FUB 901 shown in FIG. 10 is exemplary in nature and may be interfaced or coupled with the computer system in various different configurations and locations without departing from the spirit and scope of the exemplary embodiments of the present invention.

Figure 11:
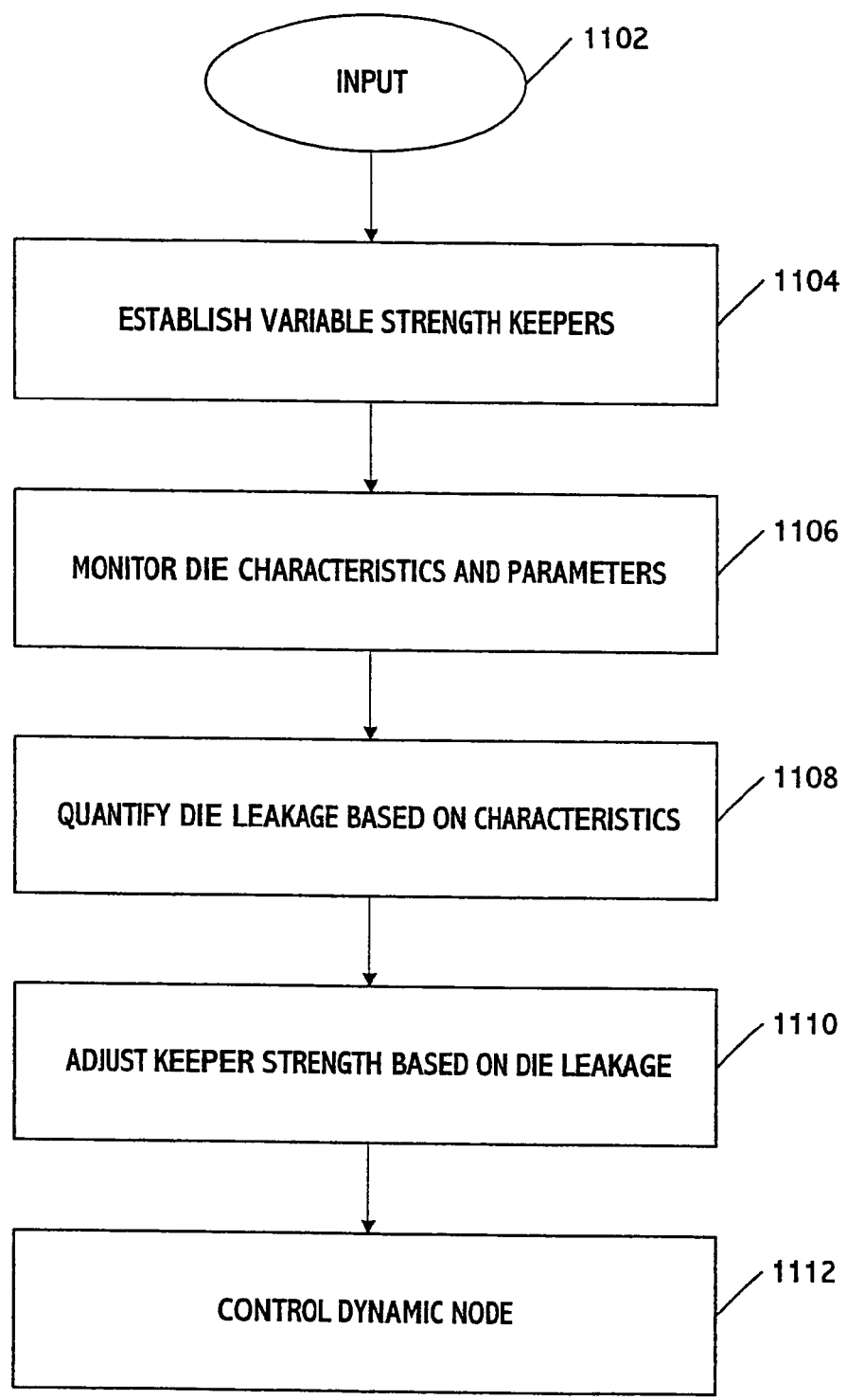
FIG. 11 is a flowchart of an exemplary method for implementing a variable keeper strength process compensated dynamic circuit.

In FIG. 11, a method for implementing a process compensated dynamic circuit is disclosed. A control input 1102 is used to establish which one of the variable strength keepers 1104 should be activated. Different die characteristics and parameters are monitored and assessed 1106. A level of die leakage based on these characteristics and parameters is quantified 1108. The keeper strength is adjusted based upon the die leakage 1110. This variably adjusted level of keeper strength is then used to control a dynamic node to a desired level 1112.

This process-compensated dynamic circuit and method provides a robust digital method to overcome intrinsic parameter variations. As a result of using a process-compensated dynamic circuit, the wide robustness and delay distribution becomes narrower, thereby improving performance, without sacrificing worst-case robustness. As technology scales, not only does the leakage increase, but its distribution also gets wider.

Consequently, the advantages of using scaled devices diminishes since the increased leakage and process variation forces the need for larger keepers (hence, larger contention). In the invention, the strength of the keeper is programmed depending on the amount of die leakage. Thus, the keeper will have an optimal strength for the best and worst case leakage levels. Because of this characteristic, better performance is possible with improved worst-case robustness.

Another situation arises when circuit designers implement VLSI technology that scales into the sub-100 nm levels, the aggravation of current ratios (e.g. Ion to Ioff) and increasing intrinsic parameter fluctuations are some of the problems facing circuit designers. The advantages typically associated with traditional CMOS scaling, such as higher performance and lower power consumption, become less and less rewarding. In these circumstances, excess leakage (e.g. current and/or voltage) and large variations in component performance characteristics, start adversely impacting the circuit.

For example, OR type dynamic circuits are affected, since the strength of the keeper has to be upsized in successive generations to meet target robustness in high leakage dies. One purpose of a keeper is to hold a dynamic node of a device (e.g. a transistor) to a high state, when none of the pull down paths are evaluating. Another purpose of a keeper circuit is to keep or maintain a voltage level imposed at a dynamic node stable.

One exemplary embodiment of a process-compensated dynamic (PCD) circuit technique is to adjust the keeper strength depending on a level of die leakage in order to meet target robustness, without sacrificing performance. The PCD circuit implements a technique that can accurately measure the die leakage and generate control signals (e.g. three (3) bit keeper control signals). Those skilled in the art will appreciate that 3 bit keeper control signals are an exemplary embodiment and that a greater or lesser number of control bits and signals may be used without departing from the spirit and scope of the present invention.

Figure 12:
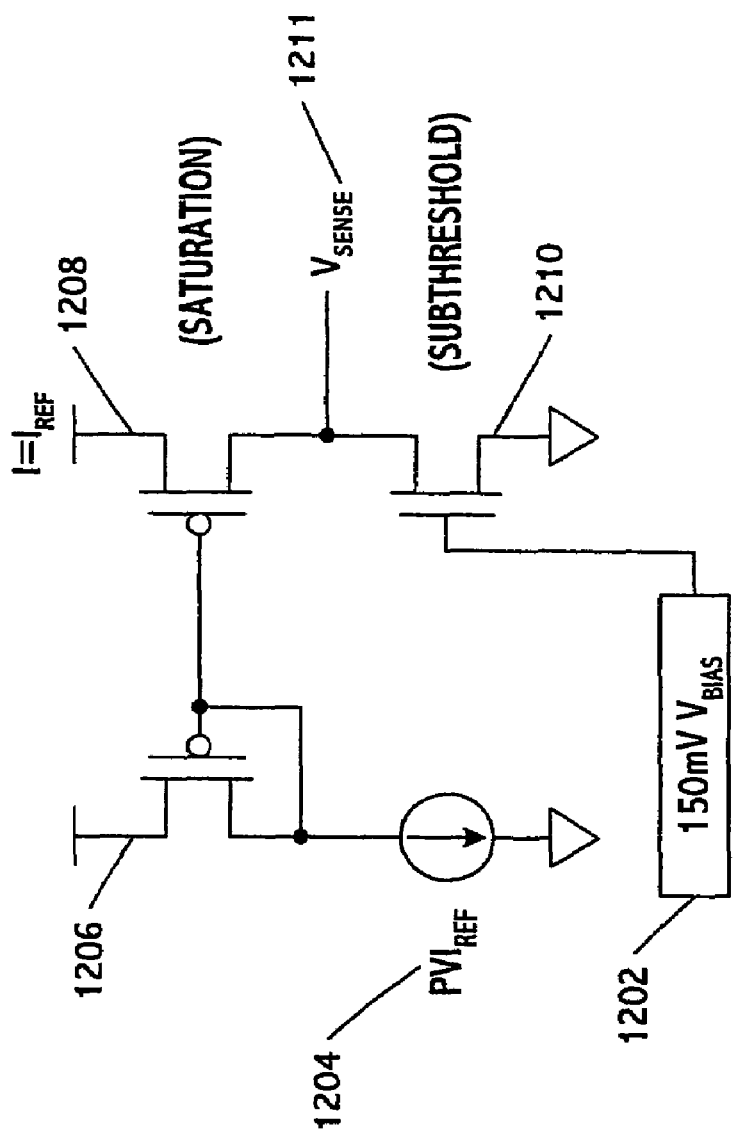
FIG. 12 is a diagram of an exemplary leakage current sensing circuit.

FIG. 12 is diagram illustrating an exemplary embodiment of a leakage current sensing circuit, including a bias voltage source 1202 and a process-voltage (PV) compensated current source 1204. In FIG. 12, a single channel implementation is shown. Later in the detailed description, multiple channel implementations will also be disclosed.

The exemplary circuit shown in FIG. 12 includes three transistors 1206, 1208 and 1210 with the transistors electrically coupled as shown in the FIG. 12. In this exemplary embodiment, the gate of transistor 1204 is coupled to the gate of transistor 1208. The output of transistor 1208 is coupled to an input of transistor 1210. In one preferred embodiment, transistors 1206 and 1208 are PMOS type devices, while transistor 1210 is an NMOS type device. Those skilled in the art will realize that other device types and permutations of these devices may also be used.

In FIG. 12, the exemplary embodiment shows a 150 mV bias voltage source 1202 applied to the gate of transistor 1210. A process-voltage (PV) compensated current source 1204 is coupled to an output of transistor 1206 and the gate of transistor 1208. The value Vsense (1211) indicates the leakage level of transistor 1210.

During the operation of the leakage current sensing circuit shown in FIG. 12, transistor 1208 operates in a saturation mode and transistor 1210 operates in a subthreshold mode. Those skilled in the art will recognize that saturation mode refers to a transistor state where a maximum amount of current is flowing through the device. A subthreshold mode refers to a transistor state where the device is operating at a level below a threshold voltage, where the threshold voltage refers to a gate-source voltage at which the drain current of the device begins to flow through the device.

The basic operational principle of the exemplary leakage sensor shown in FIG. 12 follows. When a high drain voltage is applied to a transistor (e.g., transistor 1210 in FIG. 12), the barrier height between the drain and source is lowered, resulting in a decrease of threshold voltage (Vt), and thereby increasing the subthreshold leakage. Inversely, for a constant bias current to flow through a transistor, a larger drain voltage must be developed when the Vt is higher.

By letting a constant bias current flow through a subthreshold device, one can detect the leakage (or Vt) by measuring the developed drain voltage. A subthreshold device may be a device that is specifically designed to operate in a subthreshold region (as described above) or the device may be a device that is coupled and operated in the manner of a subthreshold device.

In certain subthreshold devices, a 10 mV change in Vt translates into approximately 100 mV change in drain voltage. As a result of this characteristic, a ten times (10×) higher sensitivity can be gained compared to Vt measurement circuits. Moreover, by using a saturation mode PMOS to mirror the bias current, a two times (2×) higher gain can be achieved compared to previous linear mode PMOS implementations.

In order to improve the speed and stability of the response, the leakage of device 1210 is amplified by applying a 150 mV gate bias. This bias voltage should be relatively insensitive to process or voltage changes, since a small variation in gate voltage will cause an exponential change in transistor leakage. The bias current for transistor 1210 is mirrored from a PV compensated current source using a saturation mode PMOS transistor 1208.

Under a constant bias current, a larger drain voltage will be developed when the leakage of transistor 1210 is small. Conversely, a smaller drain voltage will be developed when the leakage of transistor 1210 is higher. In FIG. 12, Vsense 1211 indicates the leakage level of transistor 1210 based upon the drain voltage (i.e. is the drain voltage increasing, decreasing or staying the same?).

Figure 13:
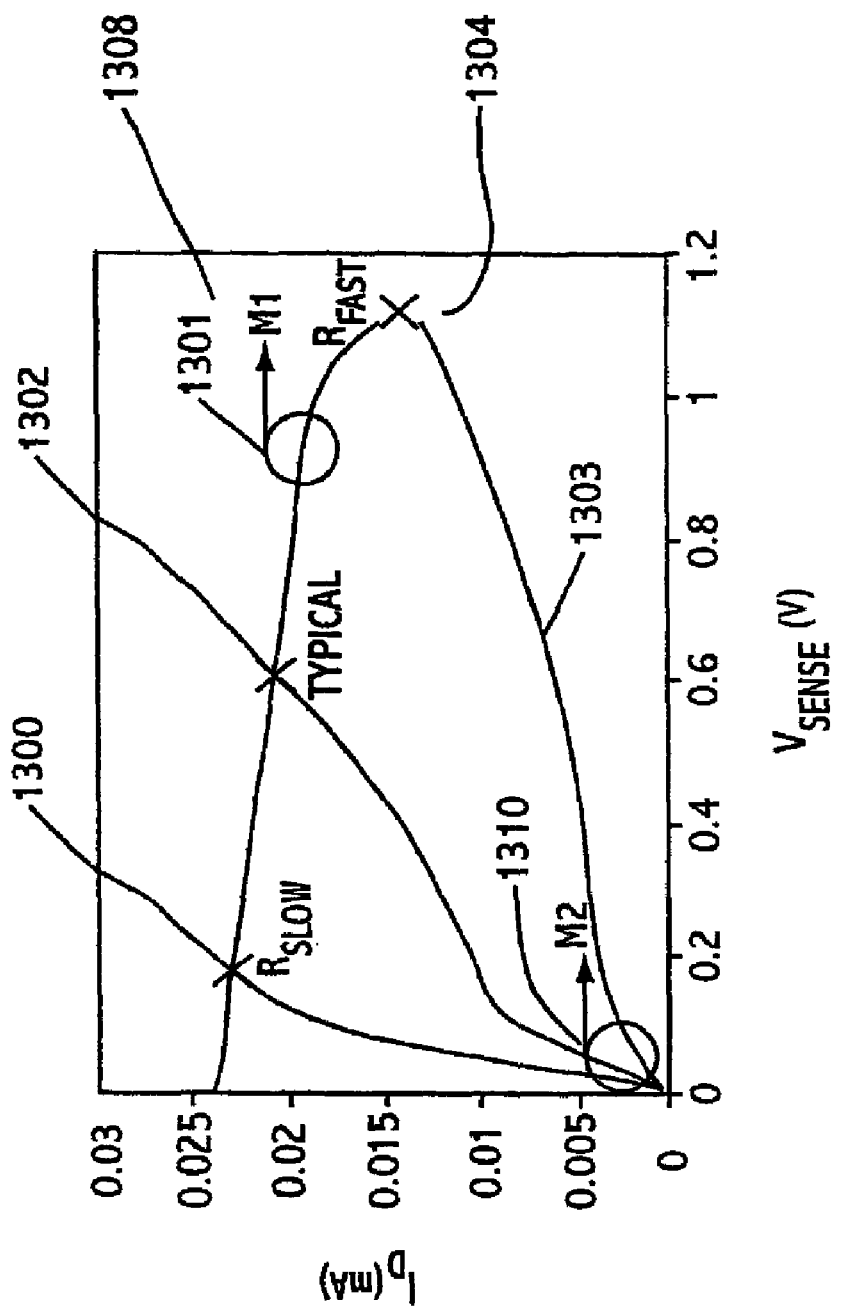
FIG. 13 is diagram illustrating exemplary I-V characteristics of various transistor devices.

In FIG. 13, the I-V characteristics of exemplary transistor devices 1308 and 1310 for different skews (e.g. slow, typical and fast) are shown to illustrate the change in Vsense for different process skews, with current in milliamperes (mA) represented along the y-axis and voltage in volts (V) represented along the x-axis. The three different curves (1300, 1302 and 1304) in FIG. 2 denote the corresponding I-V curves for slow (1300), typical (1302), and fast (1304) process responses. In FIG. 13, the I-V curve of transistor 1308 is represented by 1301 and the I-V curve of transistor 1210 is represented by 1303.

The large shift in the I-V curve of 1210 (1303) makes the intersection point (which corresponds to the Vsense) change from 0.2V (fast) to 1.1V (slow), thereby providing a wide dynamic range of Vsense.

Figure 14:
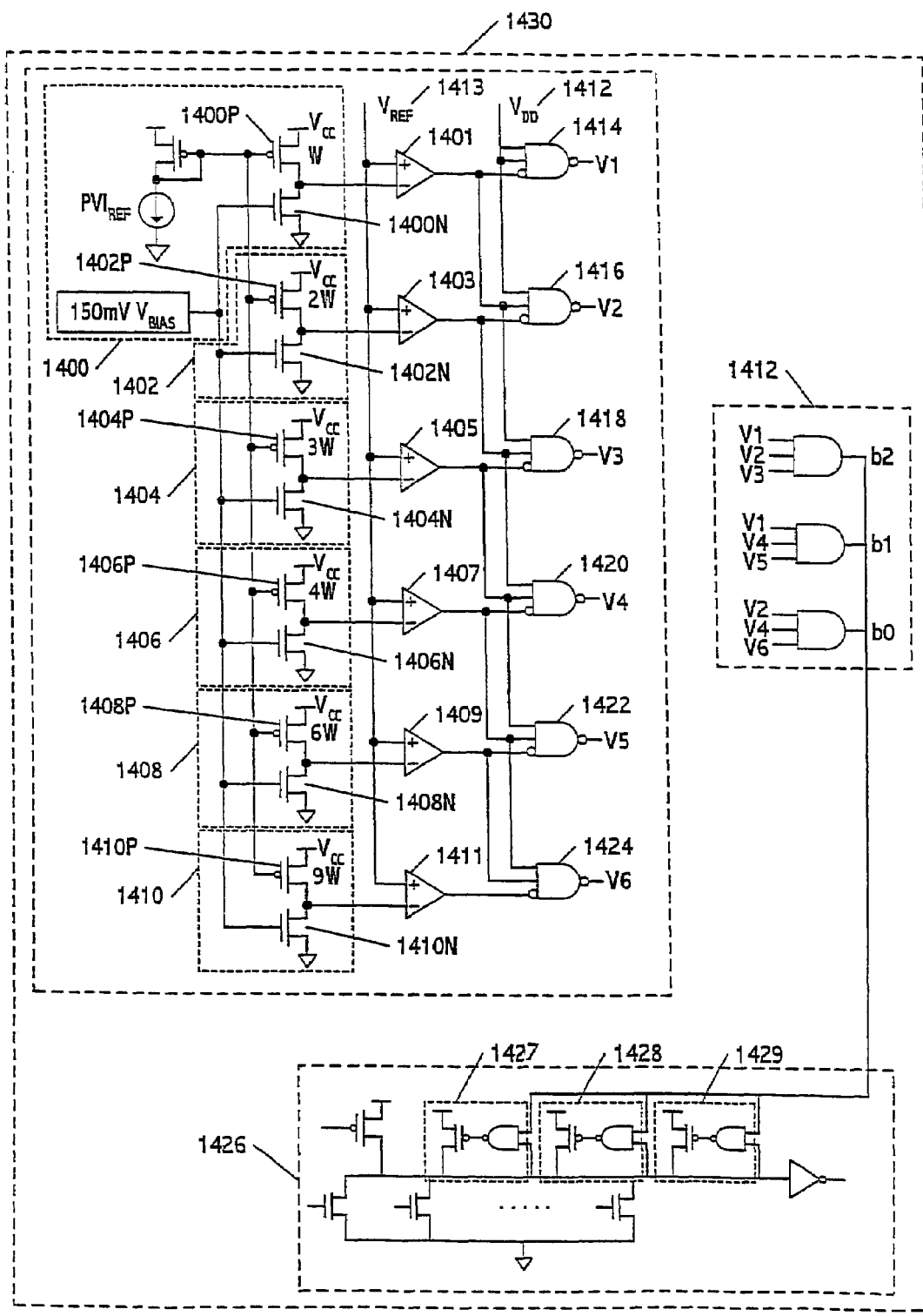
FIG. 14 is an exemplary diagram of a 6-channel leakage current monitor system for a process compensated dynamic circuit.

An exemplary embodiment of a six (6)-channel leakage current monitor system 1432 for an exemplary process compensated dynamic circuit 1426 is shown in FIG. 14. FIG. 14 represents an exemplary embodiment of a leakage current monitor system 1432 based on the subthreshold drain induced barrier lowering (DIBL) effect. In FIG. 14, item 1400 refers to a single channel leakage current monitor system building block. This single channel LCM building block corresponds to the one previously discussed in FIG. 12.

In FIG. 14, note that there are six of these LCM building blocks coupled together. The six building blocks illustrated in FIG. 14 are 1400, 1402, 1404, 1406, 1408 and 1410. Each of these building blocks can be thought of as representing a channel of the circuit.

Channel 1 of building block 1400 has the source of PMOS transistor (1400p) coupled to a supply voltage Vcc and the drain of a PMOS transistor (1400p) coupled to the drain of an NMOS transistor (1400n). The PMOS transistor that makes up LCM building block 1 has an effective keeper width of W and this refers to channel 1.

Channel 2 of building block 1402 has the source of PMOS transistor (1402p) coupled to a supply voltage Vcc and the drain of a PMOS transistor (1402p) coupled to the drain of an NMOS transistor (1402n). The PMOS transistor that makes up LCM building block 1402 has an effective keeper width of 2W and this refers to channel 2.

Channel 3 of building block 1404 has the source of PMOS transistor (1404p) coupled to a supply voltage Vcc and the drain of a PMOS transistor (1404p) coupled to the drain of an NMOS transistor (1404n). The PMOS transistor that makes up LCM building block 1404 has an effective keeper width of 3W and this refers to channel 3.

Channel 4 of building block 1406 has the source of PMOS transistor (1406p) coupled to a supply voltage Vcc and the drain of a PMOS transistor (1406p) coupled to the drain of an NMOS transistor (1406n). The PMOS transistor that makes up LCM building block 1406 has an effective keeper width of 4W and this refers to channel 4.

Channel 5 of building block 1408 has the source of PMOS transistor (1408p) coupled to a supply voltage Vcc and the drain of a PMOS transistor (1408p) coupled to the drain of an NMOS transistor (1408n). The PMOS transistor that makes up LCM building block 1408 has an effective keeper width of 6W and this refers to channel 5.

Channel 6 of building block 1410 has the source of PMOS transistor (1410p) coupled to a supply voltage Vcc and the drain of a PMOS transistor (1410p) coupled to the drain of an NMOS transistor (1410n). The PMOS transistor that makes up LCM building block 1410 has an effective keeper width of 9W and this refers to channel 6.

An output of each coupled transistor pair (e.g. 1400p and 1430n) is fed into the negative input (also known as the inverting input) of an associated operational amplifier (e.g. 1401 for transistors 1400p and 1400n). A common voltage reference (Vref) 1413 is fed into the positive input (also known as the non-inverting input) of an operational amplifier.

The output of each operational amplifier (1401, 1403, 1405, 1407, 1409 and 1411) is then fed into an input (e.g., the inverting input) of a three input NAND gate. More specifically, the output of operational amplifier 1401 is fed into an input of NAND gate 1414. The output of operational amplifier 1403 is fed into an input of NAND gate 1416. The output of operational amplifier 1405 is fed into an input of NAND gate 1418. The output of operational amplifier 1407 is fed into an input of NAND gate 1420. The output of operational amplifier 1409 is fed into an input of NAND gate 1422. The output of operational amplifier 1411 is fed into an input of NAND gate 1424.

In FIG. 14, the inputs for each NAND gate are as follows. In NAND gate 1414, two Vdd inputs (1417) are input into NAND gate 1414 along with the output of the operational amplifier 1401. The output of this NAND gate 1414 is V1.

In NAND gate 1416, a Vdd input (1417) and an input from operational amplifier 1403 is input into NAND gate 1416, along with the output of the operational amplifier 1401. The output of this NAND gate 1416 is V2.

In NAND gate 1418, an input from operational amplifier 1401 and an input from operational amplifier 1403 is input into NAND gate 1418, along with the output of the operational amplifier 1405. The output of this NAND gate 1418 is V3.

In NAND gate 1420, an input from operational amplifier 1403 and an input from operational amplifier 1405 is input into NAND gate 1420 along with the output of the operational amplifier 1407. The output of this NAND gate 1420 is V4.

In NAND gate 1422, an input from operational amplifier 1405 and an input from operational amplifier 1407 is input into NAND gate 1422 along with the output of the operational amplifier 1409. The output of this NAND gate 1422 is V5.

In NAND gate 1424, an input from operational amplifier 1407 and an input from operational amplifier 1409 is input into NAND gate 1424 along with the output of the operational amplifier 1411. The output of this NAND gate 1424 is V6.

In FIG. 14, 1412, the outputs V1, V2 and V3 are ANDed together to create control bit b2. The outputs of V1, V4 and V5 are ANDed together to form control bit b1. The outputs of V2, V4 and V6 are ANDed together to form control bit b0. These three control bits enable seven (7) possible output codes.

The possible 7 output codes that may be supported by a 6-channel leakage monitor system are {001, 010, 011, 100, 101, 110, 111}. These output codes map to keeper sizes of {1.7%, 3.4%, 5.1%, 6.8%, 8.5%, 10.2%, 11.9%}. FIG. 15 illustrates exemplary logic values and how they map to corresponding keeper sizes of {1.7%, 3.4%, 5.1%, 6.8%, 8.5%, 10.2%, 11.9%} for a PCD using a 6-channel leakage current monitor system.

The control bits generated from 1412 are then used to connect to an exemplary process compensated dynamic circuit 1426 and select a keeper circuit (e.g. 1427, 1428 and 1429). The exemplary leakage current monitor circuit illustrated in FIG. 14 operates in the following manner. Six LCMs having different levels of leakage threshold are used to determine where the device leakage level sits in one of seven (7) bins. A bin is a way of characterizing and compartmentalizing a level of die leakage. Those skilled in the art will appreciate that a greater or lesser number of bins or other such categorization methods may be used without departing from the spirit and scope of the present invention.

Once a level of leakage is determined, it is placed into one of the 7 bins. Each channel consists of the basic leakage sensor circuit previously shown and discussed in FIG. 12. The bias current from the PV compensated current source is mirrored at a different ratio to each channel. Six different bias currents will give 6 levels of sensing voltages. The sensing voltage of each channel is compared with a reference voltage Vref. In one exemplary embodiment, the outputs of the comparators (V1-V6) could be a thermometer code with a single transition. However, sometimes a lone 1 will occur within the string of 0s (or a 0 within the string of 1s) due to comparator metastability, noise, etc. The bubbles across 3 adjacent channels can be removed with three-input NAND gates. This modification requires two 1s immediately above a 0 in order to determine the transition point in the thermometer code. Three AND gates having appropriate inputs will generate the final keeper control bits b[2:0]. Table 1 summarizes the V1-V6 values and their corresponding output code b[2:0] and keeper sizes. The control bits b[2:0] are routed throughout the die (or FUB) to program the keeper strength.

The outputs V1 through V6 are then input into three AND gates as shown in 1412 and three control bits b0, b1 and b2 are generated. These control bits are then input into an exemplary process-compensated dynamic circuit 1426 of FIG. 4.

Figure 16:
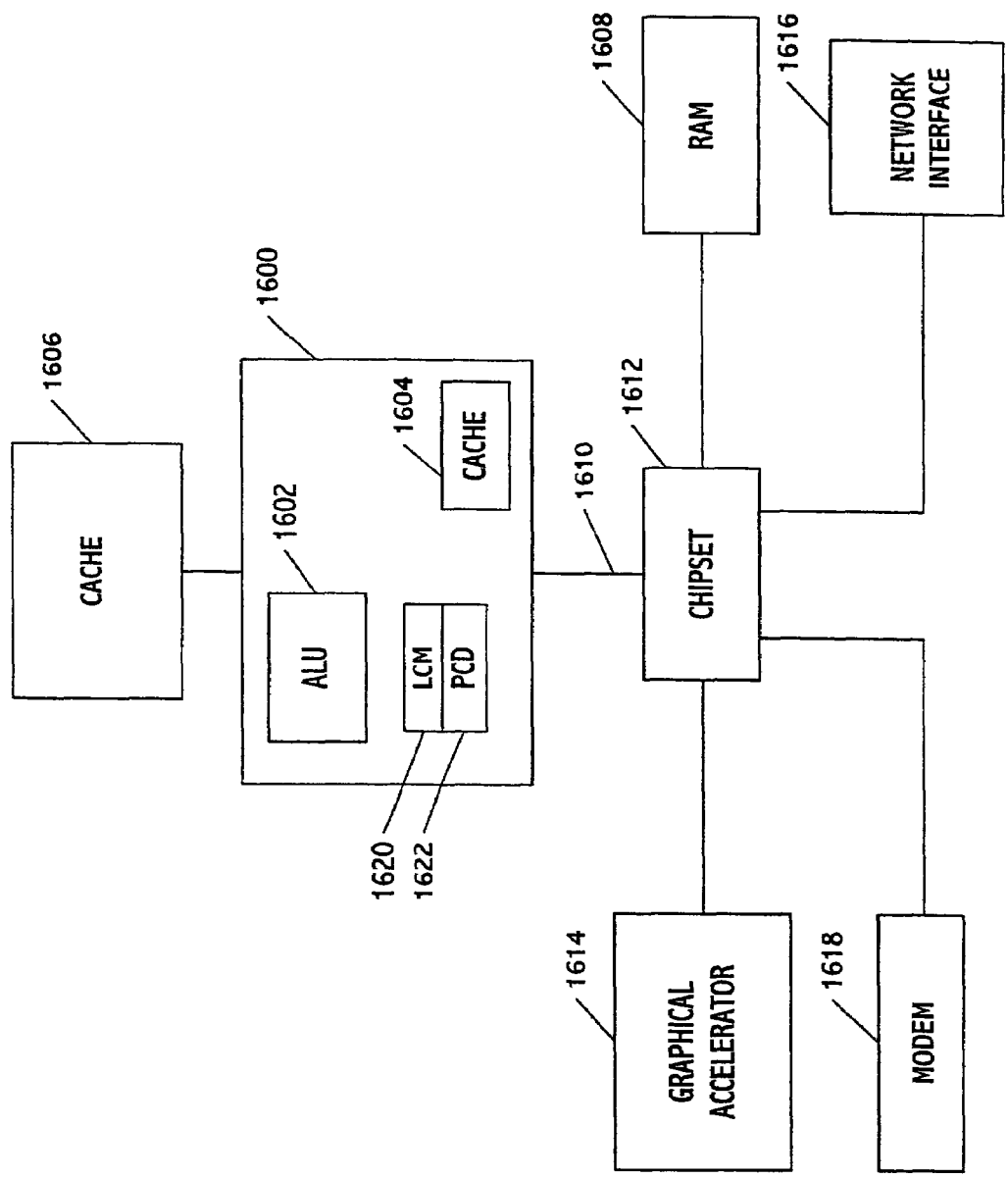
FIG. 16 is an exemplary diagram of an exemplary computer system implementing a current mirror based multi-channel leakage current monitor.

FIG. 16 is an exemplary global illustration of a computer incorporating a leakage current monitor in accordance with the invention. The computer system may include a microprocessor 1600, which includes many sub-blocks, such as an arithmetic logic unit (ALU) (1602) and an on-die cache 1604. Microprocessor 1600 may also communicate to other levels of cache, such as off-die cache 1606. Higher memory hierarchy levels such as system memory 1608 (e.g. RAM), are accessed via host bus 1610 and chipset 1612. In addition, other off-die functional units, such as a graphics accelerator 1614, network interface controller 1616 and modem 1618, to name just a few, may communicate with microprocessor 1600 via appropriate busses, ports or other communication devices.

In FIG. 16, an exemplary leakage current monitor 1620 is connected to chipset 1612. In turn, the LCM 1620 is connected to an exemplary PCD circuit 1622. Note that the LCM 1620 is exemplary in nature and may be interfaced or coupled with the computer system in various different configurations and locations without departing from the spirit and scope of the embodiments of the invention (e.g. within a preprocessor) a register file, or cache).

Figure 17:
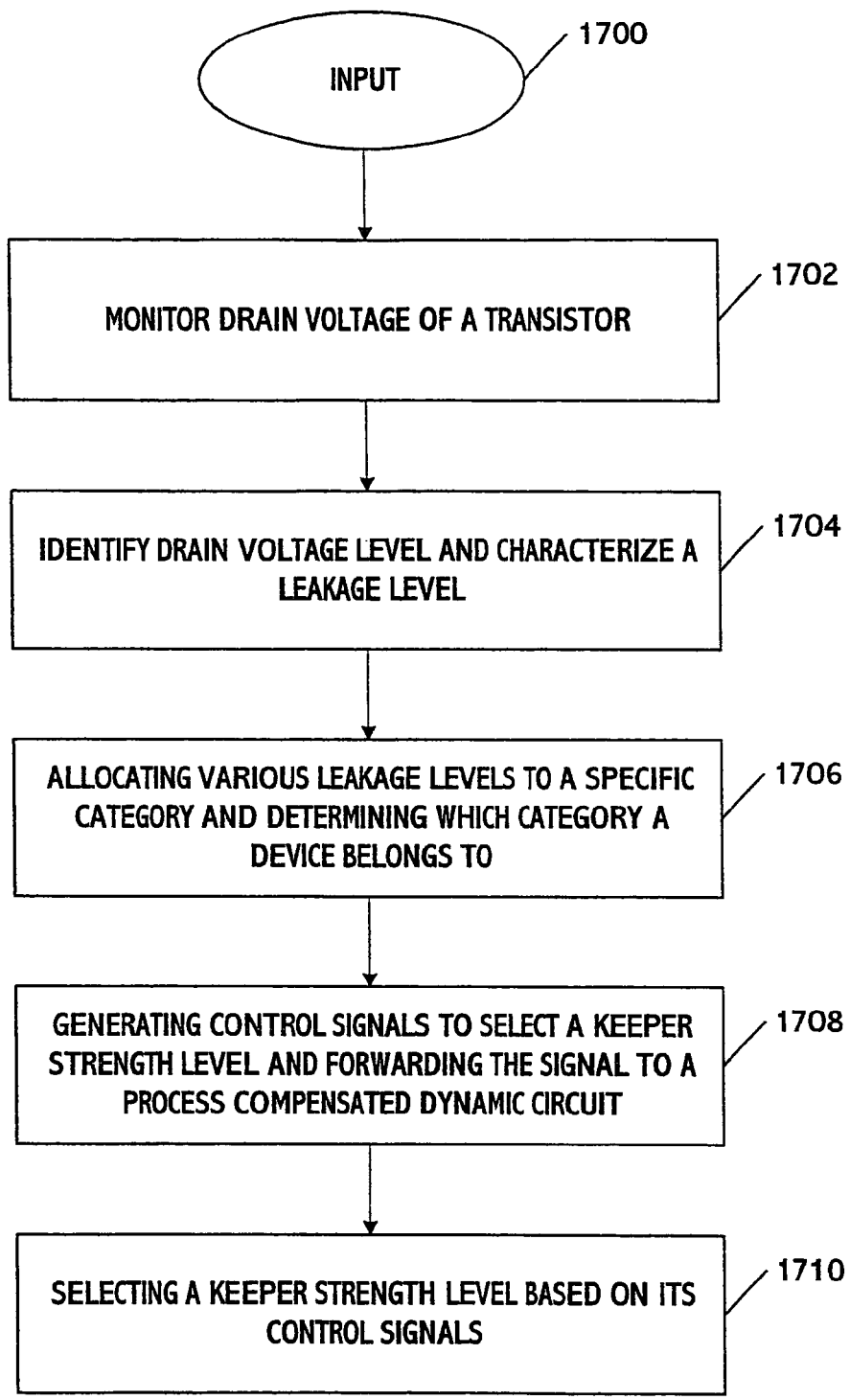
FIG. 17 is an exemplary method for implementing a current mirror based multi-channel leakage current monitor.

In FIG. 17, an exemplary embodiment of a method of implementing a leakage current monitor is disclosed. A control input 1700 is used to initiate monitoring the drain voltage 1702 of a transistor or group of transistors that are coupled together (e.g., see FIGS. 12 and 14 for an exemplary coupling configuration). Based upon the monitored drain voltage, a level of drain voltage is characterized and associated with a leakage level 1704. The various leakage levels that are determined are broken down into different storage compartments or bins, and the devices that are being monitored are grouped into the different bins based upon a measured leakage 1706. The LCM generates control signals and bits 1708 and these control signals are forwarded to a process compensated circuit for selecting a desired level of keeper strength 1710.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A leakage current monitoring circuit, comprising:
   a die leakage sensor including a bias voltage source and a process-voltage compensated current source; and
   a logic device to provide binary signals based on a leakage level determined by the die leakage sensor, the binary signals to adjust a strength of a digital keeper circuit.

2. The leakage current monitoring circuit of claim 1, wherein the die leakage sensor measures a drain voltage of a transistor.

3. The leakage current monitoring circuit of claim 2, wherein the measured drain voltage comprises a parameter used to quantify the leakage level.

4. The leakage current monitoring circuit of claim 1, wherein the die leakage sensor comprises a plurality of sensors each to sense a voltage of a different one of a plurality of transistors.

5. The leakage current monitoring circuit of claim 4, wherein the sensed voltage comprises a drain voltage.

6. The leakage current monitoring circuit of claim 1, wherein the die leakage sensor further includes at least a first transistor, a second transistor and a third transistor.

7. The leakage current monitoring circuit of claim 6, wherein the first transistor is coupled to the process voltage compensated current source, the second transistor is coupled to the first transistor, the third transistor is coupled to the second transistor, and the bias voltage source is coupled to the third transistor, and a drain voltage applied to at least one of the first transistor, the second transistor or the third transistor lowers a barrier height between a drain and a source.

8. The leakage current monitoring circuit of claim 7, wherein lowering the barrier height decreases a threshold voltage and increases sub-threshold leakage current.

9. The leakage current monitoring circuit of claim 1, wherein the digital keeper circuit to control a node to a desired level based on the binary signals.

10. A leakage current monitoring circuit comprising:
   a die leakage sensor; and
   a logic device to provide binary signals based on a leakage level determined by the die leakage sensor, the binary signals to adjust a strength of a digital keeper circuit, the digital keeper circuit to control a node to a desired level based on the binary signals.

11. The leakage current monitoring circuit of claim 10, wherein the die leakage sensor measures a drain voltage of a transistor.

12. The leakage current monitoring circuit of claim 11, wherein the measured drain voltage comprises a parameter used to quantify the leakage level.

13. The leakage current monitoring circuit of claim 10, wherein the die leakage sensor comprises a plurality of sensors each to sense a voltage of a different one of a plurality of transistors.

14. The leakage current monitoring circuit of claim 10, wherein the die leakage sensor includes a bias voltage source and a process-voltage compensated current source.

15. The leakage current monitoring circuit of claim 10, wherein the die leakage sensor further includes a first transistor, a second transistor and a third transistor.

16. The leakage current monitoring circuit of claim 15, wherein the first transistor is coupled to the process voltage compensated current source, the second transistor is coupled to the first transistor, the third transistor is coupled to the second transistor, and the bias voltage source is coupled to the third transistor, and a drain voltage applied to at least one of the first transistor, the second transistor or the third transistor lowers a barrier height between a drain and a source.

17. The leakage current monitoring circuit of claim 16, wherein lowering the barrier height decreases a threshold voltage and increases sub-threshold leakage current.

18. An apparatus comprising:
   a die leakage sensor including a process-voltage compensated current source to determine a leakage level;
   a logic circuit coupled to the die leakage sensor to provide binary signals based on the determined leakage level; and
   a digital keeper circuit to receive the binary signals from the logic circuit and to adjust a strength based on the received binary signals.

19. The apparatus of claim 18, wherein the die leakage sensor further includes a bias voltage source.

20. The apparatus of claim 18, wherein the die leakage sensor measures a drain voltage of a transistor.

21. The apparatus of claim 18, wherein the die leakage sensor comprises a plurality of sensors each to sense a voltage of a different one of a plurality of transistors.

22. The apparatus of claim 18, wherein the die leakage sensor further includes a first transistor, a second transistor and a third transistor.

23. The apparatus of claim 22, wherein the first transistor is coupled to the process voltage compensated current source, the second transistor is coupled to the first transistor, the third transistor is coupled to the second transistor, and the bias voltage source is coupled to the third transistor, a drain voltage applied to at least one of the first transistor, and the second transistor or the third transistor lowers a barrier height between a drain and a source.

* * * * *